(12) United States Patent
Beers et al.

(10) Patent No.: US 8,241,468 B2
(45) Date of Patent: Aug. 14, 2012

(54) METHOD AND APPARATUS FOR CATHODIC ARC DEPOSITION OF MATERIALS ON A SUBSTRATE

(75) Inventors: Russell A. Beers, Manchester, CT (US); Asumini Kasule, New Britain, CT (US); Kevin Lee Collins, Mansfield, TX (US)

(73) Assignee: United Technologies Corporation, Hartford, CT (US)

( * ) Notice: Subject to any disclaimer, the term of this patent is extended or adjusted under 35 U.S.C. 154(b) by 1705 days.

(21) Appl. No.: 11/010,890

(22) Filed: Dec. 13, 2004

(65) Prior Publication Data

US 2006/0124450 A1 Jun. 15, 2006

(51) Int. Cl.
*C23C 14/32* (2006.01)
(52) U.S. Cl. .............. 204/192.38; 204/298.41
(58) Field of Classification Search .......... 204/298.41, 204/192.38
See application file for complete search history.

(56) References Cited

U.S. PATENT DOCUMENTS

| | | | | |
|---|---|---|---|---|
| 4,919,968 A * | 4/1990 | Buhl et al. | | 427/580 |
| 5,401,543 A | 3/1995 | O'Neill et al. | | |
| 5,503,725 A * | 4/1996 | Sablev et al. | | 204/192.12 |
| 5,932,078 A * | 8/1999 | Beers et al. | | 204/298.41 |
| 6,009,829 A | 1/2000 | Ramalingam | | |
| 6,036,828 A | 3/2000 | Beers et al. | | |
| 2003/0230483 A1 * | 12/2003 | Sunthankar et al. | | 204/298.41 |

FOREIGN PATENT DOCUMENTS

| | | |
|---|---|---|
| DE | 4109213 C1 | 4/1992 |
| EP | 0583473 A1 | 2/1994 |
| EP | 0905272 A2 | 3/1999 |
| JP | 6506986 T | 8/1994 |
| JP | 7118832 A | 5/1995 |
| JP | 11140631 A | 5/1999 |
| WO | 92/19785 A1 | 11/1992 |

OTHER PUBLICATIONS

Japanese Office Action dated Apr. 14, 2009.

* cited by examiner

*Primary Examiner* — Keith Hendricks
*Assistant Examiner* — Jason M Berman
(74) *Attorney, Agent, or Firm* — Bachman & LaPointe, P.C.

(57) ABSTRACT

A method for applying a coating by a cathodic is provided. The method includes the steps of: a) providing a cathodic arc coater that includes a power source and utilizes a disk-shaped cathode, the cathode having an evaporative surface extending between a first end surface and a second end surface, wherein the evaporative surface has an area; b) determining a maximum acceptable power density for the evaporative surface; and c) applying a magnitude of electrical current from the power source to the cathode, wherein the electrical current magnitude divided by the area is equal to or less than the maximum acceptable power density for the evaporative surface.

7 Claims, 2 Drawing Sheets

METHOD AND APPARATUS FOR CATHODIC ARC DEPOSITION OF MATERIALS ON A SUBSTRATE

BACKGROUND OF THE INVENTION

1. Technical Field

This invention relates to apparatus for vapor deposition of coatings in general, and to cathodic arc vapor deposition apparatus in particular.

2. Background Information

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in an evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current (DC) power supply is attached to the source material (hereinafter referred to as the "cathode") and the positive lead is attached to an anodic member. An arc-initiating trigger, at or near the same electrical potential as the anode, contacts the cathode and subsequently moves away from the cathode. When the trigger is still in close proximity to the cathode, the difference in electrical potential between the trigger and the cathode causes an arc of electricity to extend therebetween. As the trigger moves further away, the arc jumps between the cathode and the anodic chamber. The exact point, or points, where an arc touches the surface of the cathode is referred to as an arc spot. Absent a steering mechanism, an arc spot will move randomly about the surface of the cathode.

The energy deposited by the arc at an arc spot is intense; on the order of $10^5$ to $10^7$ amperes per square centimeter with a duration of a few to several microseconds. The intensity of the energy raises the local temperature of the arc spot to approximately equal that of the boiling point of the cathode material (at the evacuated chamber pressure). As a result, cathode material at the arc spot vaporizes into a plasma containing atoms, molecules, ions, electrons, and particles. Positively charged ions liberated from the cathode are attracted toward any object within the deposition chamber having a negative electrical potential relative to the positively charged ion. Some deposition processes maintain the substrate to be coated at the same electrical potential as the anode. Other processes use a biasing source to lower the potential of the substrate and thereby make the substrate relatively more attractive to the positively charged ions. In either case, the substrate becomes coated with the vaporized material liberated from the cathode.

Cathodic arc deposition has historically been used to apply relatively thin coatings (2-5 mils; 1 mil=25.4 microns=25.4× $10^{-6}$ m) to substrates. The deposition rate of cathodic arc coaters is typically relatively slow (e.g., 0.3 mil/hr), but has not been a substantial concern in view of the thin coatings. Applying a relatively thick coating (10-200 mils) has heretofore not been practical because of the substantial time required to apply the coating at the deposition rate of currently available cathodic arc coaters (e.g., at 0.3 mil/hr, a 150 mil thick coating would take at least 500 hrs)

It may be possible to slightly increase the deposition rate of an existing cathodic arc coater by only increasing the current applied. The increase in deposition rate is limited however, by the apparatus currently available. Significantly increasing the current in currently available cathodic arc coaters is likely to cause the portion of the cathode proximate the arc to undesirably melt or increase the chance that undesirable macroscopic particles will be liberated. In addition, most currently available cathodic arc coaters could not accommodate an appreciable increase in current without incurring significant damage.

In short, what is needed is an apparatus and method for cathodic arc vapor deposition of material on a substrate that is capable of operating at a high deposition rate.

DISCLOSURE OF THE INVENTION

According to the present invention, a method for applying a coating by a cathodic arc is provided. The method includes the steps of: a) providing a cathodic arc coater that includes a power source and utilizes a disk-shaped cathode, the cathode having an evaporative surface extending between a first end surface and a second end surface, wherein the evaporative surface has an area; b) determining a maximum acceptable power density for the evaporative surface; and c) applying a magnitude of electrical current from the power source to the cathode, wherein the electrical current magnitude divided by the area is equal to or less than the maximum acceptable power density for the evaporative surface.

An advantage of the present invention method is that a cathodic arc deposition process is enabled that will permit thick coatings (e.g., 10-200 mils) to be applied to a substrate within a commercially practical period of time. The present invention method and apparatus enables deposition rates up to and beyond 4.0 mils per hour, thereby more than doubling the deposition rate possible with currently available cathodic arc coaters of which we are aware.

Another advantage of the present apparatus and method is that the integrity of the cathode is maintained during the erosion process. The present invention permits the cathode to be eroded using a high magnitude current without causing undesirable melting of the cathode, or appreciable undesirable macroscopic particle formation.

These and other objects, features and advantages of the present invention will become apparent in light of the detailed description of the best mode embodiment thereof, as illustrated in the accompanying drawings.

DETAILED DESCRIPTION OF THE INVENTION

Figure 1:
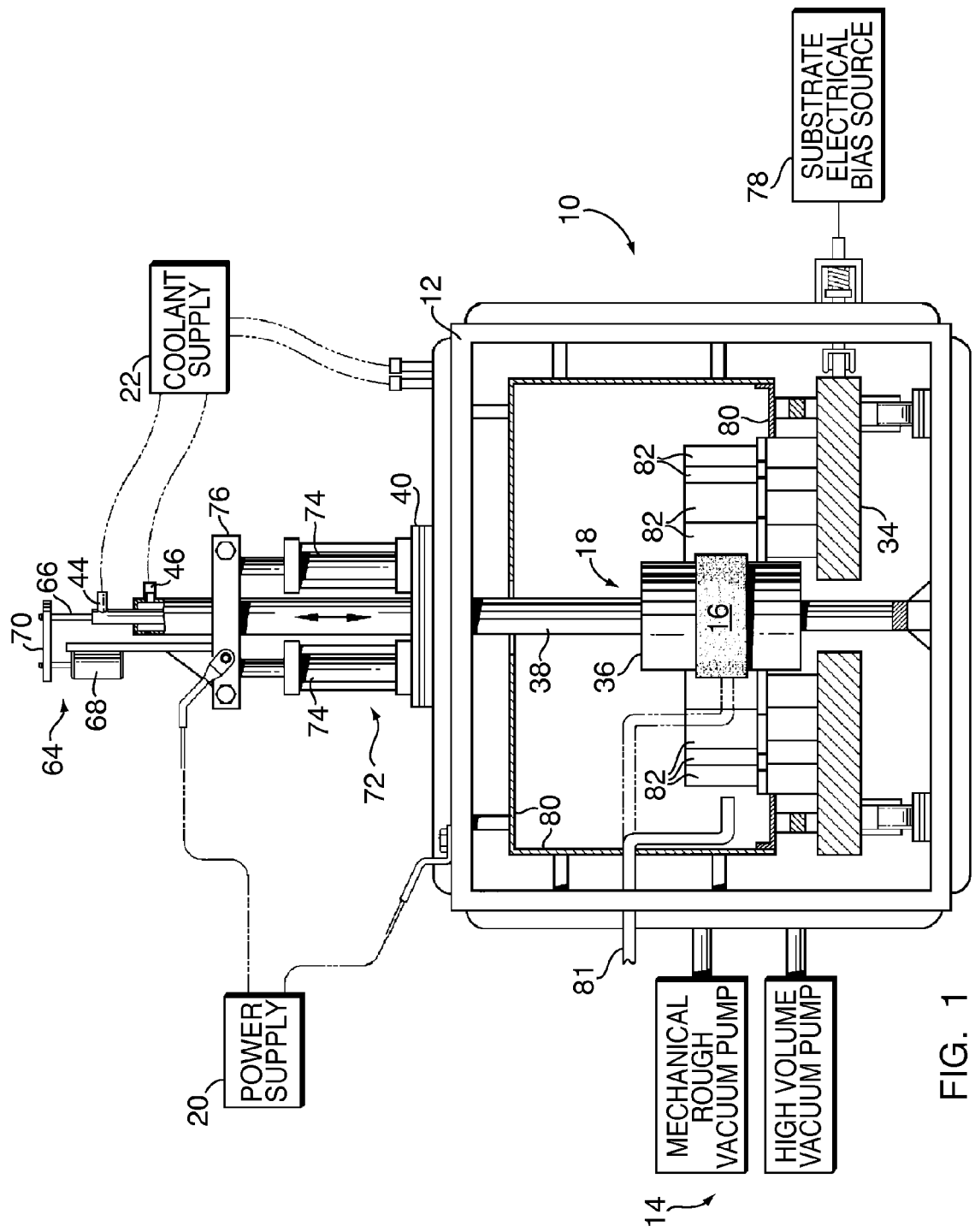
FIG. 1 is a diagrammatic view of the present invention cathodic arc vapor deposition apparatus.

Referring to FIG. 1, an apparatus for cathodic arc vapor deposition on a substrate, hereinafter referred to as a "cathodic arc coater" 10, is provided having a vessel 12, means 14 for maintaining a vacuum in the vessel 12, a cathode 16, a contactor 18, and means 20 for sustaining an arc of electrical energy between the cathode 16 and an anode. A coolant supply 22 maintains the coater 10 within acceptable temperatures by cycling coolant through cooling passages within the vessel 12 and contactor 18. In the preferred embodiment, the means 14 for maintaining a vacuum in the vessel 12 includes a mechanical rough vacuum pump and a high volume diffusion-type vacuum pump piped to the interior of the vessel 12. Other vacuum means may be used alternatively. A cathodic arc coater 10 as described in this paragraph is disclosed in U.S. Pat. No. 6,036,828, which is hereby incorporated by reference.

Figure 2:
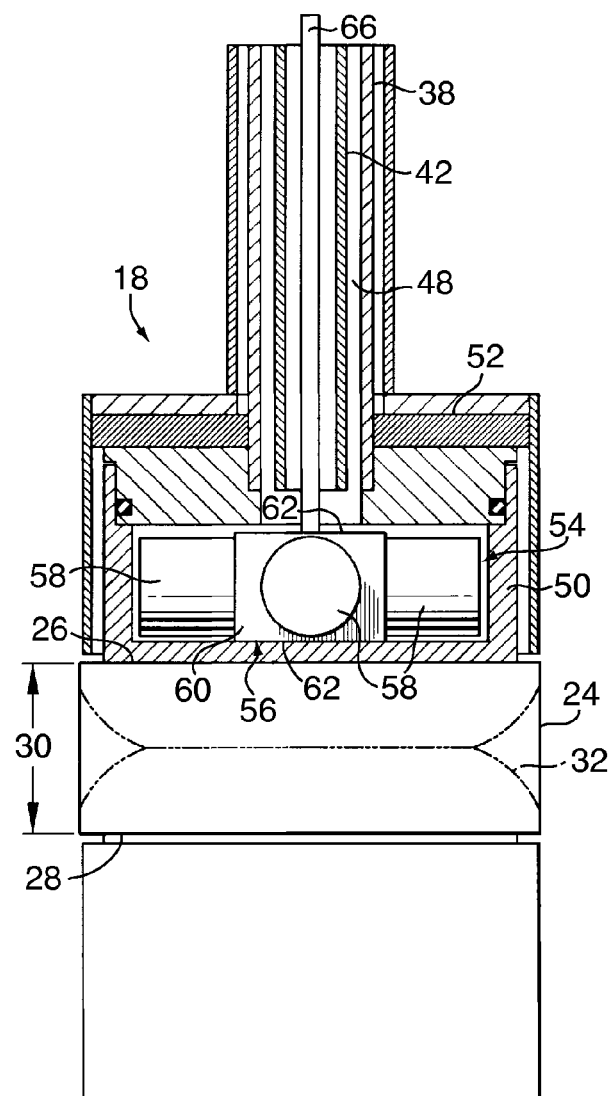
FIG. 2 is a diagrammatic view of the contactor in contact with a cathode. A magnetic field generator is disposed inside of the contactor.
Figure 3:
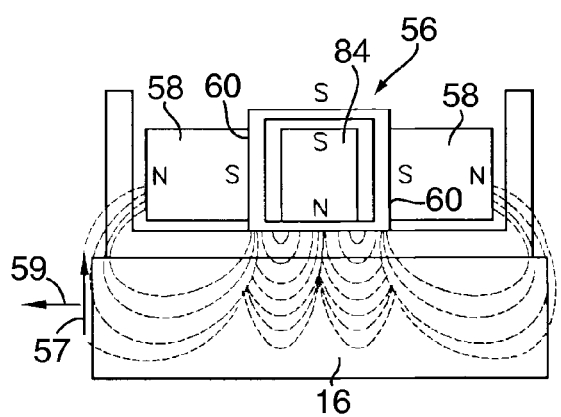
FIG. 3 is a diagrammatic view of the contactor, magnetic field generator, and cathode, illustrating magnetic field configuration.

Referring to FIGS. 1-3, the cathode 16 is a substantially cylindrical disk having an axially extending evaporative surface 24 extending between a pair of end surfaces 26,28. The coating to be deposited dictates the material composition of the cathode 16. The end surfaces 26,28 are substantially parallel with one another. The axial length 30 of the cathode 16 is equal to or greater than the anticipated final width of the erosion pattern 32 (shown in phantom) along the evaporative surface 24 of the cathode 16. Keeping the erosion pattern 32 between the end surfaces minimizes the possibility that the arc will leave the evaporative surface 24 of the cathode 16.

The cathode 16 has a maximum acceptable evaporative surface 24 heat transfer flux that occurs when subjected to a particular power density value. The term "heat transfer flux value" is defined as the average heat transfer value exiting a unit of evaporative surface 24 area of the cathode 16. The term "power density" is defined as the magnitude of electrical power introduced into the cathode 16 (i.e., "cathode amperage") divided by the area of the evaporative surface 24. A portion of the cathode amperage/electrical energy introduced into the cathode 16 exits the cathode 16 via an electrical arc extending between the cathode 16 and an anode, but a significant portion of the energy exits the cathode 16 in the form of thermal energy. The thermal energy is a function of the electrical resistance provided by the cathode material (e.g., a cathode that is more electrically conductive will produce less thermal energy than a cathode that is less electrically conductive). According to the present invention, the thermal flux (thermal energy/unit area) exiting the evaporative surface 24 must be below a particular value. That value will depend principally on the cathode material, is associated with a particular power density value, and is dictated by the maximum amount of heat transfer that can occur for that cathode material while maintaining macroscopic particle creation to a tolerable level. The tolerable level will depend upon the application, but in all cases a tolerable level is that which can occur and still produce a coating operable for the application contemplated. An example is provided below.

The cathode evaporative surface 24 is sized to create a power density that in turn produces an average heat transfer flux through the evaporative surface 24 that is equal to or less than the maximum acceptable heat transfer flux value for a given cathode amperage. Heat transfer at the point of the arc is greater than the maximum acceptable heat transfer flux value.

The substrates 82 to be coated are mounted on a platter 34 that preferably rolls into and out of the vessel 12. The platter 34 includes means for rotating the substrates 82 (not shown).

The contactor 18 includes a head 36 attached to a shaft 38. The head 36 is positioned inside the vessel 12 and the shaft 38 extends from the head 36 to outside the vessel 12. An insulative disk 40 (see FIG. 1) electrically insulates the contactor 18 from the vessel 12. The contactor 18 preferably further includes a cooling tube 42 coaxially positioned within the shaft 38, a coolant inlet port 44 (see FIG. 1) connected to the cooling tube 42, and a coolant exit port 46 connected to the passage 48 formed between the coaxial coolant tube 42 and shaft 38. The coaxial arrangement between the cooling tube 42 and the shaft 38 allows coolant from the coolant supply 22 to enter the cooling tube 42 and return via the passage 48 between the shaft 38 and the cooling tube 42, or vice versa.

The contactor 18 head includes a cup 50, a shaft flange 52, and a magnetic field generator 54. The shaft flange 52 is fixed to the shaft 38 and the cup 50 is removably attached to the shaft flange 52. The cup 50, shaft flange 52, and shaft 38 are fabricated from an electrically conductive material such as a copper alloy.

The magnetic field generator 54 includes a ferromagnetic centerpiece 56, and a plurality of magnets 58. The centerpiece 56 includes at least one side surface 60 extending between two end surfaces 62. The magnets 38 are preferably permanent magnets, although alternative magnetic field sources such as electromagnetics may be used. The magnets 38 are attached to the centerpiece 56. In all embodiments, the number of magnets 38 can be varied to accommodate the process at hand.

Referring to FIGS. 1 and 2, apparatus 64 is included for rotating the magnetic field generator 54. The rotation apparatus 64 includes a rod 66 extending through the coolant tube 42 and into the head 36 where it connects with the ferromagnetic centerpiece 56. The opposite end of the rod 66 is connected to a variable speed drive motor 68 via a drive belt 70.

In some embodiments, the cathodic arc coater 10 includes an actuator 72 for selectively actuating the contactor 18 into electrical contact with the cathode 16. The actuator 72 includes a pair of two-way actuating cylinders 74 (e.g., hydraulic or pneumatic) acting between the vessel 12 and a shaft flange 76 attached to the contactor shaft 38. Mechanical apparatus may be used in place of the actuating cylinders 74. A commercially available controller (not shown) can be used to control the position and force of the cylinders (or mechanical apparatus).

The cathodic arc coater 10 includes a biasing source 78 for electrically biasing the substrates 82. Negatively biasing the substrates 82 relative to the anode makes the substrates 82 electrically attractive to positive ions liberated from the cathode 16. A contact electrically connects the biasing source 78 to the platter 34. The substrates 82, which are electrically connected to the platter 22, are consequently electrically connected to the biasing source 78. Other means for electrically connecting the substrates 82 to the biasing source 78 may be used alternatively.

Deflector shields 80 are used throughout the coater 10 to confine the vaporized cathode materials in the area of the substrates 82. The deflector shields 80 attached to the vessel 12, platter, and contactor 18 also minimize undesirable material build-up on those surfaces. In the preferred embodiment, the deflector shields 80 attached to the vessel 12 are electrically connected to the vessel 12 and are made of an electrically conductive material resistant to corrosion, such as stainless steel.

The means 20 for sustaining an arc of electrical energy between the cathode 16 and an anode includes a direct current (D.C.) power supply. In the preferred embodiment, the positive lead of the power supply is connected to the vessel 12, thereby making the vessel 12 act as an anode. The negative lead of the power supply is electrically connected to the contactor shaft 38. Alternative embodiments may use an anode (not shown) disposed inside the vessel 12. An arc initiator 81, maintained at or near the electrical potential of the vessel 12, is used to initiate an arc.

Referring to FIG. 1, in the operation of the present invention cathodic arc coater 10, a plurality of substrates 82 and a cathode 16 are attached to the platter 34 and loaded into the vessel 12. The substrates 82 have been previously degreased and substantially cleaned, although each will likely have some molecular contaminant and oxidation remaining on its exterior surface. The actuating cylinders 74 subsequently actuate the contactor 18 into electrical contact with the cathode 16 and the vessel 12 is closed.

The mechanical rough vacuum pump is operated to evacuate the vessel 12 to a predetermined pressure. Once that pressure is reached, the high volume diffusion vacuum pump further evacuates the vessel 12 to near vacuum conditions. The substrates 82 are then cleaned of any remaining contaminants and/or oxidation by a method such as "sputter cleaning". Sputter cleaning is a process well known in the art and will not be described in detail here. Other cleaning methods may be used alternatively. After the substrates 82 are cleaned, the contaminants are purged typically using an inert gas.

Prior to initiating an arc, several steps are performed. The substrates 82 are electrically biased via the biasing source 78, making them electrically attractive to positive ions emitted from the cathode 16. The substrates 82 are rotated at a predetermined rotational speed. The power supply is adjusted to produce a cathode amperage that establishes an arc having a predetermined current, but no arc is initiated. The vacuum pumps are operated to establish and maintain a predetermined vacuum pressure of gas within the vessel 12. Coolant is cycled through the cooling passages within the vessel 12 and contactor 18. Specific process parameters will depend upon factors such as the substrate material, the material to be coated, and the desired characteristics of the coating, etc.

Once the aforementioned steps have been completed, the arc initiator 81 is brought into and out of contact with the evaporative surface 24 of the cathode 16, causing an arc to jump between the arc initiator 81 and the evaporative surface 24. The arc initiator 81 is subsequently moved a distance away from the cathode 16, preferably radially outside of the substrates 82. Once the arc initiator 81 is no longer proximate the cathode 16, the arc jumps between the cathode 16 and the deflector shields 80 electrically connected to the vessel 12 (or directly between the cathode 16 and the vessel 12).

The magnetic field generator 54 positioned in the contactor 18 drives the arc spot along the evaporative surface 24 of the cathode 16. To be more specific, each side magnet produces a magnetic field that permeates the cathode 16 and runs substantially parallel to the cathode evaporative surface 24. The direction of the magnetic field vector 57 depends upon the orientation of the magnet poles, and all the magnets 58 are oriented in like manner. A vector 59 representing the electric arc, in contrast, extends away from the evaporative surface 24 in a substantially perpendicular direction. Together, the magnetic field and the electric current of the arc create a force (the Hall effect) on the arc that causes the arc to travel a distance around the circumference of the cathode 16. The dwell time of the arc at any particular arc spot is inversely related to the Hall effect force; i.e., an increase in the Hall effect force, causes a decrease in the dwell time. A person of skill in the art will recognize that decreasing the dwell time reduces the occurrence of macroscopic particles that can adversely affect the uniformity and surface finish of the deposited coating.

The individual magnetic fields of the magnets 58 disposed along the side surface(s) of the ferromagnetic centerpiece 56, in close circumferential proximity to one another, collectively force the arc to circle the cathode evaporative surface 24 along an arc path. The number of magnets 58, the relative spacing of magnetic fields emanating from the magnets 58, and the intensity of those magnetic fields can be adjusted to satisfy the application at hand. In some applications, however, it is advantageous to further include a magnet 84 (see FIG. 3) disposed proximate the center of the ferromagnetic centerpiece 56. The magnetic field of the centrally located magnet appears to favorably influence the geometry of the magnetic fields emanating from the magnets 58 disposed along the side surfaces 60 of the ferromagnetic centerpiece.

The energy delivered by the arc causes the material at the arc spot to vaporize, thereby liberating atoms, molecules, ions, electrons, and particles from the cathode 16. The biased substrates 82 attract the ions, causing them to accelerate toward the substrates 82. The ions strike the exterior surface of the substrates 82, attach, and collectively form a coating of the cathode material.

The rate at which material is liberated from the cathode 16 and deposited onto the substrate(s) within the vessel 12 (i.e., the deposition rate) is predominantly a function of the magnitude of the cathode amperage. The maximum deposition rate for a given cathode material is dictated by the maximum acceptable heat transfer flux value for the evaporative surface 24 of the cathode 16, which is a function of the arc current magnitude.

The maximum acceptable heat transfer flux for a given disk-shaped cathode 16 comprising a particular material can be determined by empirical methods, including but not limited to, inspection of the applied coating to ascertain density, grain size, etc. Once the maximum acceptable heat transfer flux, and therefore power density, is known for the given cathode material, the deposition rate can be increased by increasing both the cathode amperage and the surface area of the cathode 16 in a ratio that maintains the heat transfer flux at or below the determined maximum acceptable heat transfer flux value.

As an example, a cathode 16 comprising a titanium alloy (e.g., Ti-8Al-1Mo-1V) is provided having a four-inch diameter and a two-inch axial height. Cathode amperage is applied to the cathode 16 and increased until the frequency and/or magnitude of macro particles and cathode melting exceeds a predetermined tolerable level. Analysis of the coatings applied at different cathode amperages provides the information necessary to establish the predetermined tolerable level. In our experience, 450 amperes of electrical power applied to the above-described four-inch diameter titanium alloy cathode 16 produces a power density of approximately 16 amperes per square inch of evaporative surface 24, which in turn produces a maximum acceptable heat transfer flux out of the evaporative surface 24 of the cathode 16. The deposition rate at a cathode amperage of 450 amperes is in the range of approximately 1.5 mils to 2.0 mils per hour. Increasing the magnitude of the electrical power applied to the same cathode 16 geometry yields a higher deposition rate, but the applied coating is less desirable.

Increasing the cathode evaporative surface area by, for example, increasing the diameter to six inches while maintaining the axial height at two-inches, decreases the power density and heat transfer flux out of the evaporative surface 24. As a result, the current applied to the cathode 16 can be increased. A current of approximately 600 amperes applied to the six-inch diameter cathode 16 comprising the aforesaid titanium alloy, creates the same power density and heat transfer flux as 450 amperes does for the four-inch diameter cathode 16. At a cathode amperage of 600 amperes, however, the deposition rate increased to within the range of approximately 3.5 mils to 4.0 mils per hour; i.e., at least twice the deposition rate possible with the four-inch cathode 16.

Referring to FIG. 1, when a coating of sufficient thickness has been deposited on the substrates 82, the power supply is turned off and the arc extinguished. The vessel 12 is purged with inert gas and brought to ambient pressure. The contactor 18 is actuated out of contact with the cathode 16 and the platter is removed from the vessel 12. The substrates 82 are subsequently removed from the platter and new substrates 82 attached. The loaded platter is then inserted back into the vessel 12 in the manner described earlier and the process repeated.

Although this invention has been shown and described with respect to the detailed embodiments thereof, it will be understood by those skilled in the art that various changes in form and detail thereof may be made without departing from the spirit and the scope of the invention.

What is claimed is:

1. A method for applying a coating by cathodic arc coater, comprising the steps of:
   providing a cathodic arc coater that includes a power source and utilizes a disk shaped cathode,
   providing a first disk shaped cathode having an evaporative surface extending axially between a first end surface and a second end surface, and the evaporative surface having a first surface area in said coater;
   determining a maximum acceptable power density for the evaporative surface of said first disk shaped cathode; and
   increasing a deposition rate of a material liberated from said cathode forming said coating;
   said deposition increasing step comprising replacing said first disk shaped cathode with a second disk shaped cathode having an evaporative surface with a second surface area greater than said first surface area and increasing current amperage applied to said second disk shaped cathode while maintaining power density equal to or less than said maximum acceptable power density.

2. The method of claim 1, wherein the determining step includes analyzing applied coatings of the material liberated from the cathode at different cathode amperages so as to determine when frequency and/or magnitude of macro particles exceed a predetermined tolerable level.

3. The method of claim 1, wherein the determining step includes analyzing the disk-shaped cathode to determine whether cathode melting has exceeded a predetermined tolerable level.

4. The method of claim 2, further comprising analyzing said disk-shaped cathode to determine whether cathode melting has exceeded a predetermined tolerable level.

5. A method for applying a coating by cathodic arc coater, comprising the steps of:
   providing a cathodic arc coater that includes a power source and utilizes a disk-shaped cathode,
   providing a first disk-shaped cathode having a first diameter, and an evaporative surface extending between a first end surface and a second end surface and having a first surface area,
   determining a maximum acceptable heat transfer flux value for the evaporative surface of the first disk-shaped cathode; and
   increasing a deposition rate of a material forming said coating;
   said deposition rate increasing step comprising replacing said first disk shaped cathode with a second disk shaped cathode having an evaporative surface with a second surface area greater than the first surface area and increasing current amperage applied to said second disk-shaped cathode while maintaining power density equal to or less than said maximum acceptable heat transfer flux value for said evaporative surface on said second disk-shaped cathode.

6. The method of claim 1, wherein said deposition rate increasing step comprises increasing the evaporative area and said current amperage in a ratio that maintains heat transfer flux at or below a determined maximum acceptable heat transfer flux value.

7. The method of claim 5, wherein said deposition rate increasing step comprises increasing the evaporative area and said current amperage in a ratio that maintains heat transfer flux at or below said maximum acceptable heat transfer flux value.

* * * * *